(12) United States Patent
Lou et al.

(10) Patent No.: US 12,089,443 B2
(45) Date of Patent: Sep. 10, 2024

(54) DISPLAY PANEL AND DISPLAY DEVICE

(71) Applicant: KunShan Go-Visionox Opto-Electronics Co., Ltd, Jiangsu (CN)

(72) Inventors: Junhui Lou, Kunshan (CN); Chao Chi Peng, Kunshan (CN)

(73) Assignee: KUNSHAN GO-VISIONOX OPTO-ELECTRONICS CO., LTD, Kunshan (CN)

( * ) Notice: Subject to any disclaimer, the term of this patent is extended or adjusted under 35 U.S.C. 154(b) by 471 days.

(21) Appl. No.: 17/522,271

(22) Filed: Nov. 9, 2021

(65) Prior Publication Data
US 2022/0069023 A1     Mar. 3, 2022

Related U.S. Application Data

(63) Continuation of application No. PCT/CN2020/099742, filed on Jul. 1, 2020.

(30) Foreign Application Priority Data

Oct. 12, 2019   (CN) .......................... 201910969630.2

(51) Int. Cl.
*H10K 59/131*   (2023.01)
*H10K 59/121*   (2023.01)
(Continued)

(52) U.S. Cl.
CPC ......... *H10K 59/121* (2023.02); *H10K 59/122* (2023.02); *H10K 59/131* (2023.02); *H10K 59/65* (2023.02)

(58) Field of Classification Search
CPC ........................... H10K 59/131; H10K 59/121
(Continued)

(56) References Cited

U.S. PATENT DOCUMENTS 11,469,261 B2 * 10/2022 Ban ...................... H10K 59/126
11,515,362 B2 * 11/2022 Yang ..................... H10K 59/65
(Continued)

FOREIGN PATENT DOCUMENTS

CN     107610635 A     1/2018
CN     108010947 A     5/2018
(Continued)

OTHER PUBLICATIONS

The International search report for PCT Application No. PCT/CN2020/099742, dated Sep. 29, 2020, 11 pages.
(Continued)

*Primary Examiner* — Christopher M Raabe
(74) *Attorney, Agent, or Firm* — Maier & Maier, PLLC

(57) ABSTRACT

A display panel and a display device. The display panel includes: a first display area and a second display area, the first display area having a light transmittance greater than that of the second display area; a plurality of first pixel groups located in the first display area, each of the plurality of first pixel groups comprising a first light-emitting pixel unit and a plurality of first non-light-emitting sub-pixels, the first light-emitting pixel unit comprising a plurality of first light-emitting sub-pixels; and a plurality of second sub-pixels located in the second display area. A first pixel arrangement architecture formed together by the plurality of first light-emitting sub-pixels and the plurality of first non-light-emitting sub-pixels is identical to a second pixel arrangement architecture formed by the plurality of second sub-pixels.

20 Claims, 4 Drawing Sheets

(51) Int. Cl.
*H10K 59/122* (2023.01)
*H10K 59/65* (2023.01)

(58) Field of Classification Search
USPC .......................................................... 313/505
See application file for complete search history.

(56) References Cited

U.S. PATENT DOCUMENTS

| | | | |
|---|---|---|---|
| 2018/0083217 A1 | 3/2018 | Chung et al. | |
| 2021/0050389 A1* | 2/2021 | Yang | H10K 59/353 |
| 2021/0408088 A1* | 12/2021 | Ban | G02F 1/136209 |
| 2024/0021148 A1* | 1/2024 | Xu | G09G 3/32 |
| 2024/0045474 A1* | 2/2024 | Bang | G06F 1/1652 |
| 2024/0065059 A1* | 2/2024 | Son | H10K 59/131 |

FOREIGN PATENT DOCUMENTS

| | | | | |
|---|---|---|---|---|
| CN | 108922900 A | | 11/2018 | |
| CN | 109801903 A | | 5/2019 | |
| CN | 110071161 A | * | 7/2019 | ......... H01L 27/3234 |
| CN | 209215619 A | | 8/2019 | |
| CN | 110289298 A | | 9/2019 | |
| CN | 209487511 U | | 10/2019 | |
| CN | 110783384 A | | 2/2020 | |

OTHER PUBLICATIONS

The First Office Action and search report for China Application No. 201910969630.2, dated Sep. 22, 2020, 6 pages.

\* cited by examiner

DISPLAY PANEL AND DISPLAY DEVICE

CROSS REFERENCE TO RELATED APPLICATION

This application is a continuation of International Application No. PCT/CN2020/099742 filed on Jul. 1, 2020, which claims the priority benefits of Chinese Patent Application No. 201910969630.2 filed on Oct. 12, 2019 and entitled "DYSPLAY PANEL AND DYSPLAY DEVICE", both of which are incorporated herein by reference in their entireties.

TECHNICAL FIELD

The application relates to the field of display, and particularly to a display panel and a display device.

BACKGROUND

With the rapid development of electronic devices, users have a higher and higher requirement on the screen-to-body ratio, such that the full-screen display of electronic devices has attracted more and more attention in the industry.

The conventional electronic devices such as cellphones, tablet computers and the like need to be integrated with front-facing cameras, speakers, and infrared sensing elements and the like. It is possible to provide a notch or an opening in the display screen, such that external light can enter the photosensitive element underneath the screen through the notch or the opening in the display screen. However, all of these electronic devices are not full screens in the true sense, and cannot display on each region of the entire screen, for example, the region corresponding to the front-facing camera cannot display a picture.

SUMMARY

Embodiments of the application provide a display panel and a display device achieving capacity of light transmittance and display in at least a partial region to facilitate under-screen integration of the photosensitive components.

In an aspect, an embodiment of the application provides a display panel comprising: a first display area; a second display area, the first display area having a light transmittance greater than that of the second display area; a plurality of first pixel groups located in the first display area, each of the plurality of first pixel groups comprising a first light-emitting pixel unit and a plurality of first non-light-emitting sub-pixels, the first light-emitting pixel unit comprising a plurality of first light-emitting sub-pixels; and a plurality of second sub-pixels located in the second display area, wherein a first pixel arrangement architecture formed together by the plurality of first light-emitting sub-pixels and the plurality of first non-light-emitting sub-pixels is identical to a second pixel arrangement architecture formed by the plurality of second sub-pixels.

In the display panel according to an embodiment of the application, the first display area has a light transmittance greater than that of the second display area, such that the display panel can be integrated with a photosensitive component on the back side of the first display area to achieve under-screen integration of a photosensitive component such as a camera while the first display area can display a picture, thereby improving the display area of the display panel and realizing the overall screen design of a display device.

The display panel comprises a plurality of first pixel groups in the first display area, each of which comprises a first light-emitting pixel unit and a plurality of first non-light-emitting sub-pixels, wherein the first light-emitting pixel unit comprises a plurality of first light-emitting sub-pixels. Since the first pixel group has both the plurality of first light-emitting sub-pixels capable of light-emitting displaying and the plurality of first non-light-emitting sub-pixels without light-emitting displaying, the actual Pixels Per Inch (PPI) of the first display area can be reduced, wherein only the plurality of first light-emitting sub-pixels need to be connected to the drive signal lines, thereby reducing the number of drive signal lines arranged in the first display area, and facilitating to improve the light transmittance of the second display area.

A first pixel arrangement architecture formed together by the plurality of first light-emitting sub-pixels and the plurality of first non-light-emitting sub-pixels is identical to a second pixel arrangement architecture formed by the plurality of second sub-pixels in the second display area, such that the display panel can improve the light transmittance of the first display area while blurring the boundary between the second display area of higher PPI and the first display area of lower PPI in the displayed picture of the display panel, thereby avoiding the obvious boundary between the two display areas, and improving the display effect.

According to the foregoing embodiment of an aspect of the application, the display panel further comprises: a transition display area located between the first display area and the second display area;

a first pixel circuit located in the transition display area, the first pixel circuit being electrically connected to the first light-emitting sub-pixel for driving the first light-emitting sub-pixel to display; a plurality of third pixel groups located in the transition display area, each of the plurality of third pixel groups comprising a third light-emitting pixel unit and a plurality of third non-light-emitting sub-pixels, the third light-emitting pixel unit comprising a plurality of third light-emitting sub-pixels, a third pixel arrangement architecture formed together by the plurality of third light-emitting sub-pixels and the plurality of third non-light-emitting sub-pixels being identical to the second pixel arrangement architecture.

The first pixel circuit for driving the first light-emitting sub-pixel to display are located in the transition display area, thereby reducing the wiring structure in the first display area and increasing the light transmittance of the first display area. The display panel further comprises a plurality of third pixel groups located in the transition display area. The third pixel arrangement architecture formed together by the plurality of third light-emitting sub-pixels and the plurality of third non-light-emitting sub-pixels comprised in the third pixel group is the same as the second pixel arrangement architecture, such that the boundary between the second display area of higher PPI and the transition display area of lower PPI in the displayed picture of the display panel is blurred, thereby avoiding a clear boundary between the two display areas and improving the display effect.

According to any of the foregoing embodiments of an aspect of the application, the plurality of second sub-pixels and the plurality of third light-emitting sub-pixels comprise multiple types of sub-pixels of different colors respectively, the size of the plurality of third light-emitting sub-pixels being the same as that of the plurality of second sub-pixels of an identical color.

According to any of the foregoing embodiments of an aspect of the application, the plurality of first light-emitting sub-pixels and the plurality of second sub-pixels comprise multiple types of sub-pixels of different colors respectively, the size of the plurality of first light-emitting sub-pixels being smaller than that of the plurality of second sub-pixels of an identical color, such that the non-light-emitting region in the first display area is larger, facilitating further improvement of the light transmittance of the first display area.

According to any of the foregoing embodiments of an aspect of the application, in the first pixel arrangement architecture, the plurality of first light-emitting sub-pixels in each first light-emitting pixel unit are arranged to be adjacent to each other; and/or in the third pixel arrangement architecture, the plurality of third light-emitting sub-pixels in each third light-emitting pixel unit are arranged to be adjacent to each other.

According to any of the foregoing embodiments of an aspect of the application, the plurality of first non-light-emitting sub-pixels in each of the plurality of first pixel groups are arranged to form at least one first non-light-emitting pixel unit, the arrangement pattern of the plurality of first non-light-emitting sub-pixels in the at least one first non-light-emitting pixel unit being matched with that of the plurality of first light-emitting sub-pixels in the first light-emitting pixel unit, the first light-emitting pixel unit and the at least one first non-light-emitting pixel unit being arranged in an array, wherein the first light-emitting pixel units of at least a portion of the adjacent first pixel groups are located in different rows or columns to reduce dark lines in the direction of row or in the direction of column formed by the continuous first non-light-emitting pixel units and improve display effect; and/or the plurality of third non-light-emitting sub-pixels in each of the plurality of third pixel groups are arranged to form at least one third non-light-emitting pixel unit, the arrangement pattern of the plurality of third non-light-emitting sub-pixels in the at least one third non-light-emitting pixel unit being matched with that of the plurality of third light-emitting sub-pixels in the third light-emitting pixel unit, the third light-emitting pixel unit and the at least one third non-light-emitting pixel unit being arranged in an array, wherein the third light-emitting pixel units of at least a portion of the adjacent third pixel groups are located in different rows or columns to reduce dark lines in the direction of row or in the direction of column formed by the continuous third non-light-emitting pixel units and improve display effect.

According to any of the foregoing embodiments of an aspect of the application, in the first pixel arrangement architecture, at least any two of the plurality of first light-emitting sub-pixels in each first light-emitting pixel unit are spaced apart by a first non-light-emitting sub-pixel, such that the plurality of first light-emitting sub-pixels of various colors in the first display area can be distributed more uniformly, thereby improving the color uniformity of display; and/or in the third pixel arrangement architecture, at least any two of the plurality of third light-emitting sub-pixels in each third light-emitting pixel unit are spaced apart by a third non-light-emitting sub-pixel, such that the plurality of third light-emitting sub-pixels of various colors in the transition display area can be distributed more uniformly, thereby improving the color uniformity of display.

According to any of the foregoing embodiments of an aspect of the application, the plurality of first light-emitting sub-pixels and the plurality of third light-emitting sub-pixels comprise a multiple types of sub-pixels of different colors respectively, the first light-emitting sub-pixel and the plurality of first non-light-emitting sub-pixels being arranged in an array, the plurality of first light-emitting sub-pixels of an identical color of at least a portion of the adjacent first pixel groups being located in different rows or columns, such that the plurality of first light-emitting sub-pixels of various colors in the first display area are distributed further uniformly, thereby further improving the color uniformity of display, and the interval between the plurality of first light-emitting sub-pixels of an identical color is improved to provide more sufficient wiring space for sub-pixel combining of the plurality of first light-emitting sub-pixels of an identical color; and/or the plurality of third light-emitting sub-pixels and the plurality of third non-light-emitting sub-pixels being arranged in an array, the plurality of third light-emitting sub-pixels of an identical color of at least a portion of the adjacent third pixel groups are located in different rows or columns, such that the plurality of third light-emitting sub-pixels of various colors in the transition display area are distributed further uniformly, thereby further improving the color uniformity of display, and the interval between the plurality of third light-emitting sub-pixels of an identical color is improved to provide more sufficient wiring space for sub-pixel combining of the plurality of third light-emitting sub-pixels of an identical color.

According to any of the foregoing embodiments of an aspect of the application, a display panel comprises: a substrate; a component layer located on the substrate, the first pixel circuit being located in the component layer; and a pixel definition layer located on the component layer, the pixel definition layer comprising a first pixel opening located in the first display area and a third pixel opening located in the transition display area, the first light-emitting sub-pixel comprising a first light-emitting structure, a first electrode, and a second electrode, the first light-emitting structure being located within the first pixel opening, the first electrode being located on a side of the first light-emitting structure facing toward the substrate, the second electrode being located on a side of the first light-emitting structure facing away from the substrate; the third light-emitting sub-pixel comprising a third light-emitting structure, a fifth electrode, and a sixth electrode, the third light-emitting structure being located within the third pixel opening, the fifth electrode being located on a side of the third light-emitting structure facing toward the substrate, the sixth electrode being located on a side of the third light-emitting structure facing away from the substrate.

According to any of the foregoing embodiments of an aspect of the application, the first electrodes of each first predetermined number of the light-emitting sub-pixels are electrically connected to each other via a first interconnection structure; and/or the fifth electrodes of each second predetermined number of the plurality of third light-emitting sub-pixels are electrically connected to each other via a second interconnection structure.

According to any of the foregoing embodiments of an aspect of the application, the first predetermined number is from two to eight; and/or the second predetermined number is from two to eight.

According to any of the foregoing embodiments of an aspect of the application, the first interconnection structure is arranged in the same layer as the first electrodes; and/or the second interconnection structure is arranged in the same layer as the fifth electrodes.

According to any of the foregoing embodiments of an aspect of the application, the first interconnection structure is located within the component layer and is electrically connected to the first electrodes through a first via hole; and/or the second interconnection structure is located within the component layer and is electrically connected to the fifth electrodes through a second via hole.

According to any of the foregoing embodiments of an aspect of the application, the first interconnection structure is a transparent conductive structure; and/or the second interconnection structure is a transparent conductive structure.

According to any of the foregoing embodiments of an aspect of the application, the number of the plurality of first non-light-emitting sub-pixels is a positive integer multiple of the number of the plurality of first light-emitting sub-pixels.

According to any of the foregoing embodiments of an aspect of the application, in each first pixel group, the number of the plurality of first non-light-emitting sub-pixels is 3 times that of the plurality of first light-emitting sub-pixels.

According to any of the foregoing embodiments of an aspect of the application, in each first pixel group, the number of the plurality of third non-light-emitting sub-pixels is a positive integer multiple of the number of the plurality of third light-emitting sub-pixels.

According to any of the foregoing embodiments of an aspect of the application, in each third pixel group, the number of the plurality of third non-light-emitting sub-pixels is 3 times that of the plurality of third light-emitting sub-pixels.

According to any of the foregoing embodiments of an aspect of the application, a ratio of the number of the plurality of first non-light-emitting sub-pixels to the number of the plurality of first light-emitting sub-pixels in each first pixel group, is equal to a ratio of the number of the plurality of third non-light-emitting sub-pixels to the number of the plurality of third light-emitting sub-pixels in each third pixel group.

In another aspect, embodiments of the application provide a display device comprising the display panel of any of the aforesaid implementations.

BRIEF DESCRIPTION OF THE DRAWINGS

Other features, objects and advantages of the application will become more apparent upon reading the following detailed description of non-limiting embodiments with reference to the accompanying drawings, in which the same or similar reference numerals refer to identical or similar features. The drawings are not drawn to actual scale.

DETAILED DESCRIPTION

For clearly understanding of the purpose, technical solution and advantages of the application, the application will be described in further details in combination with the drawings and specific embodiments. The specific embodiments described herein are configured to explain the application rather than to limit it. A person skilled in the art may implement the application without some of these specific details.

In this context, the relational terms, such as first and second, etc., are used only to distinguish one entity or operation from another, and do not necessarily require or imply any such actual relationship or order between these entities or operations.

On electronic devices such as cellphones, tablet computers and the like, it is necessary to integrate a photosensitive component such as a front camera, an infrared light sensor, a proximity light sensor or the like on a side of a display panel. For example, a transparent display area may be provided on the aforesaid electronic device, and the photosensitive component is arranged on the back side of the transparent display area, so as to achieve full-screen display of the electronic device while ensuring normal operation of the photosensitive component.

In order to improve light transmittance of the transparent display area and facilitate arrangement of the pixel drive circuit of the sub-pixels in the transparent display area, it is often necessary to reduce the pixels per inch (PPI) of the transparent display area and even a portion of the display area around the transparent display area, such that the PPI thereof is lower than the PPI of the main display area of a display panel. Now a clear display boundary is often formed between the display area of higher PPI and the display area of lower PPI, which affects the display effect.

In order to solve the above problem, embodiments of the application provide a display panel and a display device, and various embodiments of the display panel and the display device will be described below with reference to the accompanying drawings.

Embodiments of the application provide a display panel, which may be an organic light-emitting diode (OLED) display panel.

Figure 1:
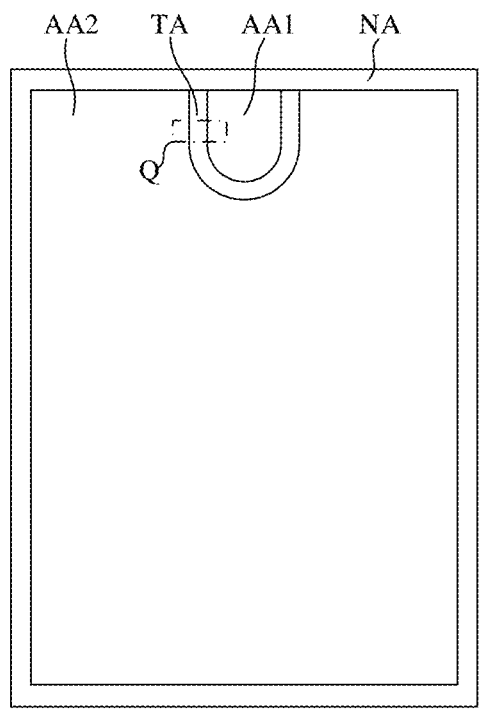
FIG. 1 is a schematic top view of a display device provided according to an embodiment of the application.
Figure 2:
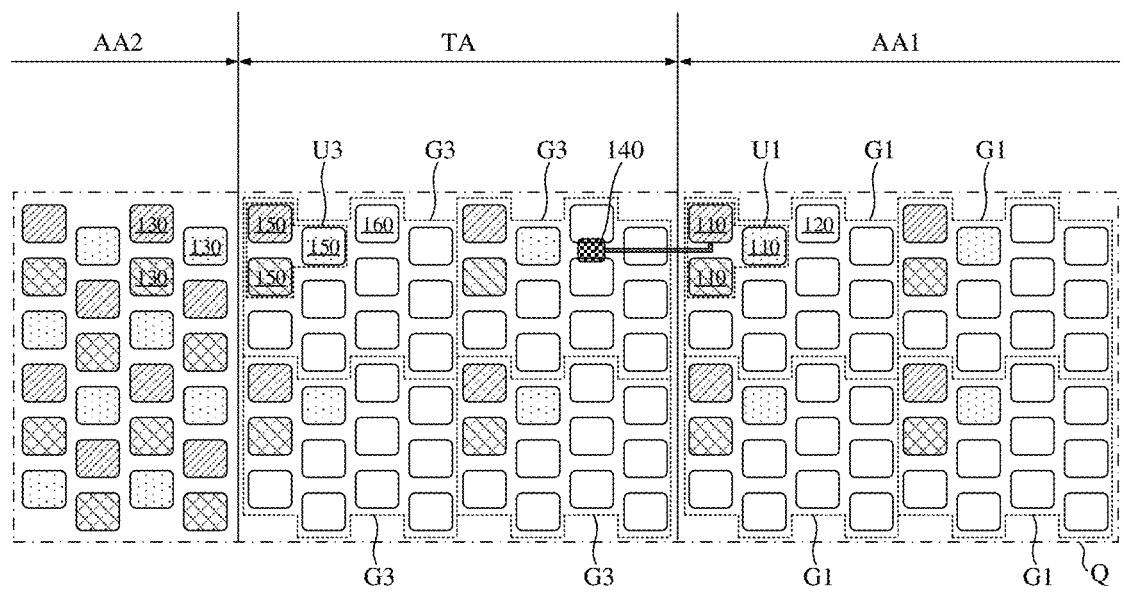
FIG. 2 is a partial enlarged view of the region Q in FIG. 1 of an example.

FIG. 1 is a schematic top view of a display panel provided according to an embodiment of the application, and FIG. 2 is a partial enlarged view of the region Q in FIG. 1 of an example.

The display panel 100 has a first display area AA1, a second display area AA2, and a non-display area NA surrounding the first display area AA1 and the second display area AA2. The light transmittance of the first display area AA1 is greater than that of the second display area AA2.

Herein the light transmittance of the first display area AA1 is greater than or equal to 15%. In order to ensure that the light transmittance of the first display area AA1 is greater than 15%, even greater than 40%, or even higher, the light transmittance of at least a portion of the functional film layers of the display panel 100 in the first display area AA1 in the embodiment is greater than 80%, and even at least a portion of the functional film layers have a light transmittance greater than 90%.

In the display panel 100 according to an embodiment of the application, the first display area AA1 has a light transmittance greater than that of the second display area AA2, such that the display panel 100 can be integrated with a photosensitive component on the back side of the first display area AA1 to achieve under-screen integration of a photosensitive component such as a camera while the first display area AA1 can display a picture, thereby improving the display area of the display panel 100 and realizing the overall screen design of the display device.

The display panel 100 comprises a plurality of first pixel groups G1 located in the first display area AA1. Each of the first pixel groups G1 comprises a first light-emitting pixel unit U1 and a plurality of first non-light-emitting sub-pixels 120, wherein the first light-emitting pixel unit U1 comprises a plurality of first light-emitting sub-pixels 110. The display panel 100 further comprises a plurality of second sub-pixels 130 located in the second display area AA2.

The first light-emitting sub-pixels 110 can emit light for displaying and the first non-light-emitting sub-pixels 120 emit no light. In some embodiments, the first light-emitting sub-pixels 110 and the second sub-pixels 130 have multiple types of sub-pixels of different colors respectively. In FIG. 2, the sub-pixels of different colors are distinguished by different hatch patterns, wherein the sub-pixels of an identical color are depicted with an identical hatch pattern.

Herein the occupied area of the non-light-emitting sub-pixels on the display panel 100 is the same as that of the light-emitting sub-pixels. The non-light-emitting sub-pixels may have the same film layer structure as the light-emitting sub-pixels, but receive no drive signal so as not to emit light. The non-light-emitting sub-pixels may also lack a complete film layer structure for the light-emitting sub-pixels so as not to emit light.

The first light-emitting sub-pixels 110 and the second sub-pixels 130 comprise multiple types of sub-pixels of different colors respectively. The first light-emitting sub-pixels 110 may comprise a red first light-emitting sub-pixel 110, a green first light-emitting sub-pixel 110, and a blue first light-emitting sub-pixel 110. In some embodiments, each of the first light-emitting pixel units U1 comprises one red first light-emitting sub-pixel 110, one green first light-emitting sub-pixel 110 and one blue first light-emitting sub-pixel 110. The display panel may comprise second pixel units in the second display area AA2, and each of the second pixel units may comprise one red second sub-pixel 130, one green second sub-pixel 130 and one blue second sub-pixel 130.

The number and the type of color of the sub-pixels comprised in each first light-emitting pixel unit U1 or each second pixel unit may be adjusted according to the design requirements of the display panel 100, so as not to be limited to the examples of the aforesaid embodiments. In addition, the arrangement of the various sub-pixels in each first light-emitting pixel unit U1 or in each second pixel unit is also not limited to the example of the above embodiment.

In the display panel 100 according to the embodiment of the application, since the first pixel group G1 has both the first light-emitting sub-pixels 110 capable of light-emitting displaying and the first non-light-emitting sub-pixels 120 without light-emitting displaying, the actual PPI of the first display area AA1 can be lowered. Wherein only the first light-emitting sub-pixels 110 are connected to the drive signal lines, such that the number of the drive signal lines arranged in the first display area AA1 is reduced, so as to improve the light transmittance of the first display area AA1.

In some embodiments, the display panel 100 also has a transition display area TA between the first display area AA1 and the second display area AA2. In some other embodiments, the display panel 100 may not be provided with the transition display area TA, i.e., the first display area AA1 is arranged to be adjacent to the second display area AA2.

When the first display area AA1 is arranged to be adjacent to the second display area AA2, in some embodiments, the first pixel arrangement architecture formed together by the first light-emitting sub-pixels 110 and the first non-light-emitting sub-pixels 120 is identical to the second pixel arrangement architecture formed by the second sub-pixels 130, such that the display panel 100 can improve the light transmittance of the first display area AA1 while blurring the boundary between the second display area AA2 of higher PPI and the first display area AA1 of lower PPI in the displayed picture of the display panel 100, thereby avoiding the obvious boundary between the two display areas, and improving the display effect.

In the following, the description is made taking the display panel 100 further comprising a transition display area TA as an example.

In some embodiments, the display panel 100 further comprises a first pixel circuit 140 located in the transition display area TA. The first pixel circuit 140 is electrically connected to a first light-emitting sub-pixel 110 for driving the first light-emitting sub-pixel 110 to display. In FIG. 2, the location of one first pixel circuit 140, which is electrically connected to the corresponding first light-emitting sub-pixel 110, is exemplarily shown. There may be more than one first pixel circuits 140, which are electrically connected to the corresponding first light-emitting sub-pixels 110 respectively.

In some embodiments, the circuit structure of the first pixel circuit 140 is any one of a 2T1C circuit, a 7T1c circuit, a 7T2C circuit, or a 9T1C circuit. The "2T1C circuit" herein means that the pixel circuit comprises two thin film transistors (T) and one capacitor (C), and the remaining "7T1C circuit", "7T2C circuit", "9T1C circuit", and so on means in a similar way.

In the display panel 100 according to the embodiment of the application, the first pixel circuit 140 for driving the first light-emitting sub-pixel 110 to display is located in the transition display area TA, thereby reducing the wiring structure in the first display area AA1 and increasing the light transmittance of the first display area AA1.

In some embodiments, the display panel 100 may further comprise a second pixel circuit located in the second display area AA2. The second pixel circuit is electrically connected to a second sub-pixel 130 for driving the second sub-pixel 130 to display. In some embodiments, the display panel 100 may further comprise a third pixel circuit located in the transition display area TA. The third pixel circuit is electrically connected to a third light-emitting sub-pixel 150 for driving the third light-emitting sub-pixel 150 to display. In some embodiments, the circuit structure of the second pixel circuit and the circuit structure of the third pixel circuit may be any one of a 2T1C circuit, a 7T1C circuit, a 7T2C circuit, or a 9T1C circuit, respectively.

In some embodiments, the display panel 100 further comprises a plurality of third pixel groups G3 located in the transition display area TA. In some embodiments, each of the third pixel groups G3 comprises a third light-emitting pixel unit U3 and a plurality of third non-light-emitting sub-pixels 160. The third light-emitting pixel unit U3 comprises a plurality of third light-emitting sub-pixels 150. The third pixel arrangement architecture formed together by the third light-emitting sub-pixels 150 and the third non-light-emitting sub-pixels 160 is identical to the second pixel arrangement architecture.

The third light-emitting sub-pixels 150 can emit light for displaying and the third non-light-emitting sub-pixels 160 emit no light. The first light-emitting sub-pixels 110, the second light-emitting sub-pixels 130, the third light-emitting sub-pixels 150 comprise multiple types of sub-pixels of different colors respectively. In some embodiments, each of the third light-emitting pixel units U3 comprises one red third light-emitting sub-pixel 150, one green third light-emitting sub-pixel 150 and one blue third light-emitting sub-pixel 150.

In the display panel 100 according to the embodiment of the application, since the third pixel group G3 has both the third light-emitting sub-pixels 150 capable of light-emitting displaying and the third non-light-emitting sub-pixels 160 without light-emitting displaying, the actual PPI of the transition display area TA can be lowered, such that there are sufficient locations to arrange the first pixel circuit 140 and the layout rationality for the pixel circuit is improved.

In addition, since the third pixel arrangement architecture formed together by the third light-emitting sub-pixels 150 and the third non-light-emitting sub-pixels 160 comprised in the third pixel group G3 is identical to the second pixel arrangement architecture, the boundary between the second display area AA2 of higher PPI and the transition display area TA of lower PPI in the displayed picture of the display panel 100 is blurred, thereby avoiding a clear boundary between the two display areas and improving the display effect.

In some embodiments, the size of the first light-emitting sub-pixel 110 is smaller than that of the second sub-pixel 130 of an identical color, such that the non-light-emitting region in the first display area AA1 is larger, facilitating further improvement of the light transmittance of the first display area AA1. In some other embodiments, the size of the first light-emitting sub-pixel 110 is not limited thereto, and for example, may be the same as that of the second sub-pixel 130 of an identical color.

In some embodiments, the size of the third light-emitting sub-pixel 150 is the same as that of the second sub-pixel 130 of an identical color, such that the display difference between the transition display area AA1 and the second display area AA2 is reduced, improving the display uniformity.

In some embodiments, in each first pixel group G1, the number of the first non-light-emitting sub-pixels 120 is a positive integer multiple of the number of the first light-emitting sub-pixels 110. Preferably, in each first pixel group G1, the number of the first non-light-emitting sub-pixels 120 is 3 times that of the first light-emitting sub-pixels 110, such that the actual PPI of the first display area AA1 is reduced to a reasonable range with respect to the PPI of the second display area AA2, so as to ensure a higher light transmittance and a better display effect in the first displayed area AA1.

In some embodiments, in each third pixel group G3, the number of the third non-light-emitting sub-pixels 160 is a positive integer multiple of the number of the third light-emitting sub-pixels 150. Preferably, in each third pixel group G3, the number of the third non-light-emitting sub-pixels 160 is 3 times that of the third light-emitting sub-pixels 150.

In some embodiments, in each first pixel group G1, a ratio of the number of the first non-light-emitting sub-pixels 120 relative to the number of the first light-emitting sub-pixels 110 is equal to a ratio of the number of the third non-light-emitting sub-pixels 160 relative to the number of the third light-emitting sub-pixels 150 in each third pixel group G3, such that the display effect of the first display area AA1 and that of the transition display area TA are uniform and the display effect is improved.

In some embodiments, in the first pixel arrangement architecture, the first light-emitting sub-pixels 110 in each first light-emitting pixel unit U1 are arranged to be adjacent to each other. As shown in FIG. 2, when the display panel further comprises a transition display area TA, in the first pixel arrangement architecture, the first light-emitting sub-pixels 110 in each first light-emitting pixel unit U1 are arranged to be adjacent to each other; and/or, in the third pixel arrangement architecture, the third light-emitting sub-pixels 150 in each third light-emitting pixel unit U3 are arranged to be adjacent to each other.

In some embodiments, the inner sub-pixel arrangement architectures of the adjacent first pixel groups G1 are identical, that is, in the adjacent first pixel groups G1, the arrangement architectures of the first light-emitting sub-pixels 110 and the first non-light-emitting sub-pixels 120 of the first light-emitting pixel units U1 are constant and identical.

Figure 3:
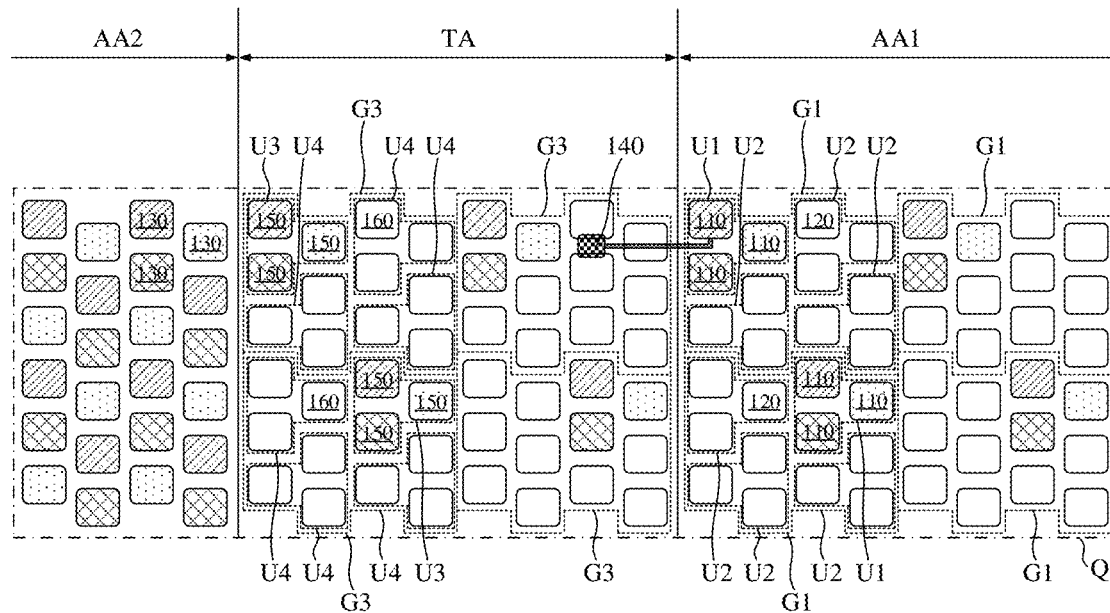
FIG. 3 is a partial enlarged view of the region Q in FIG. 1 of another example.

FIG. 3 is a partial enlarged view of the region Q in FIG. 1 of another example. A portion of the structure of the embodiment in FIG. 3 is identical with that of the embodiment in FIG. 2, and will not be described in detail herein. The difference between them will be described below.

As shown in FIG. 3, in the first pixel arrangement architecture, the first light-emitting sub-pixels 110 in each first light-emitting pixel unit U1 are arranged to be adjacent to each other; and/or in the third pixel arrangement architecture, the third light-emitting sub-pixels 150 in each third light-emitting pixel unit U3 are arranged to be adjacent to each other.

In some embodiments, the first non-light-emitting sub-pixels 120 in each first pixel group G1 are arranged to form at least one first non-light-emitting pixel unit U2, in which the arrangement pattern of the first non-light-emitting sub-pixels 120 is matched with that of the first light-emitting sub-pixels 110 in the first light-emitting sub-pixel unit. The first pixel unit U1 and the at least one first non-light-emitting pixel unit U2 are arranged in an array to form a plurality of rows and/or columns Wherein the first light-emitting pixel units U1 of at least a portion of the adjacent first pixel groups G1 are located in different rows or different columns.

In some embodiments, the first light-emitting pixel units U1 of the adjacent first pixel groups G1 in an identical row are located in an identical row, and the first light-emitting pixel units U1 of the adjacent first pixel groups G1 in an identical column are located in different columns. In some embodiments, the direction of row and the direction of column may be interchanged. In the display panel 100 according to the embodiment of the application, the first light-emitting pixel units U1 of at least a portion of the adjacent first pixel groups G1 are located in different rows or different columns, such that dark lines in the direction of row or in the direction of column formed by the continuous first non-light-emitting pixel units U2 can be reduced to improve the display effect.

In some embodiments, the third non-light-emitting sub-pixels 160 in each third pixel group G3 are arranged to form at least one third non-light-emitting pixel unit U4, in which the arrangement pattern of the third non-light-emitting sub-pixels 160 is matched with that of the third light-emitting sub-pixels 150 in the third light-emitting sub-pixel unit. The third light-emitting pixel units U3 and the at least one third non-light-emitting pixel unit U4 are arranged in an array, in which the third light-emitting pixels U3 of at least a portion of the adjacent third pixel groups G3 are in different rows or columns.

In some embodiments, the third light-emitting pixel units U3 of the adjacent third pixel groups G3 in an identical row are located in an identical row, and the third light-emitting pixel units U3 of the adjacent third pixel groups G3 in an identical column are located in different columns. In some embodiments, the direction of row and the direction of column may be interchanged. In the display panel 100 according to the embodiment of the application, the third light-emitting pixel units U3 of at least a portion of the adjacent third pixel groups G3 are located in different rows or different columns, such that dark lines in the direction of row or in the direction of column formed by the continuous third non-light-emitting pixel units U4 is reduced to improve the display effect.

Figure 4:
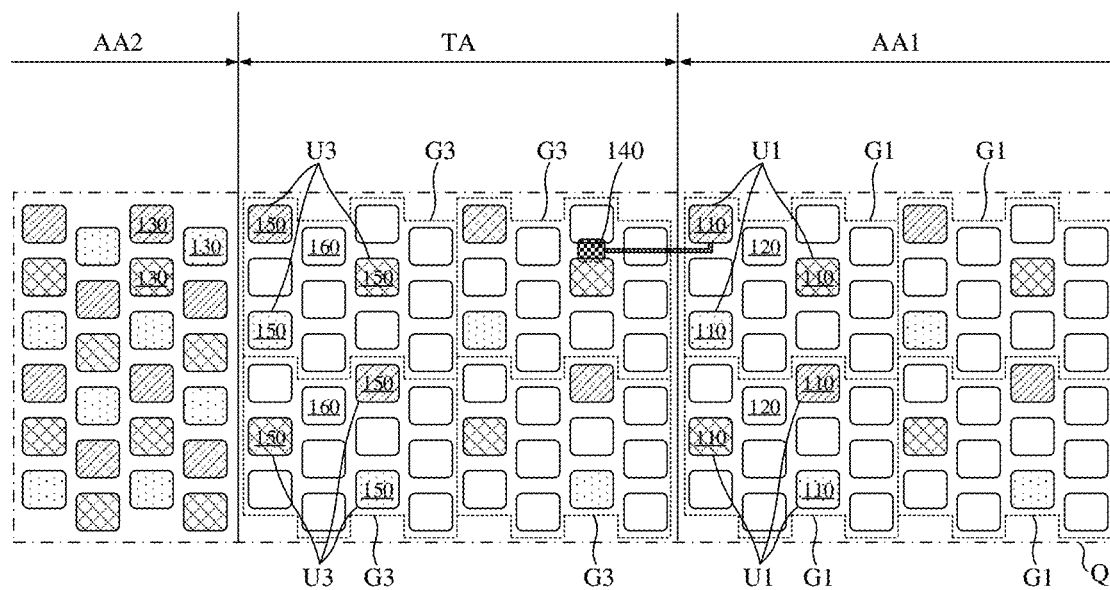
FIG. 4 is a partial enlarged view of the region Q in FIG. 1 of yet another example.

FIG. 4 is a partial enlarged view of the region Q in FIG. 1 of yet another example. A portion of the structure of the embodiment in FIG. 4 is identical with that of the embodiment in FIG. 2, and will not be described in detail herein. The difference between them will be described below.

As shown in FIG. 4, in the first pixel arrangement architecture, different from the embodiment of FIG. 2, at least any two of the first light-emitting sub-pixels 110 in each first light-emitting pixel unit U1 are spaced apart by a first non-light-emitting sub-pixel 120, such that the first light-emitting sub-pixels 110 of various colors in the first display area AA1 can be distributed more uniformly, thereby improving the color uniformity of display.

In some embodiments, in the third pixel arrangement architecture, at least any two of the third light-emitting sub-pixels 150 in each third light-emitting pixel unit U3 are spaced apart by a third non-light-emitting sub-pixel 160, such that the third light-emitting sub-pixels 150 of various colors in the transition display area TA can be distributed more uniformly, thereby improving the color uniformity of display.

Further, in some embodiments, the first light-emitting sub-pixels 110 and the first non-light-emitting sub-pixels 120 are arranged in an array to form a plurality of rows and/or columns. The first light-emitting sub-pixels 110 of an identical color of at least a portion of the adjacent first pixel groups G1 are located in different rows or columns, such that the first light-emitting sub-pixels 110 of various colors in the first display area AA1 are distributed further uniformly, thereby further improving the color uniformity of display.

In some embodiments, the third light-emitting sub-pixels 150 and the third non-light-emitting sub-pixels 160 are arranged in an array to form a plurality of rows and/or columns. The third light-emitting sub-pixels 150 of an identical color of at least a portion of the adjacent third pixel groups G3 are located in different rows or columns, such that the third light-emitting sub-pixels 150 of various colors in the transition display area TA are distributed further uniformly, thereby further improving the color uniformity of display.

Figure 5:
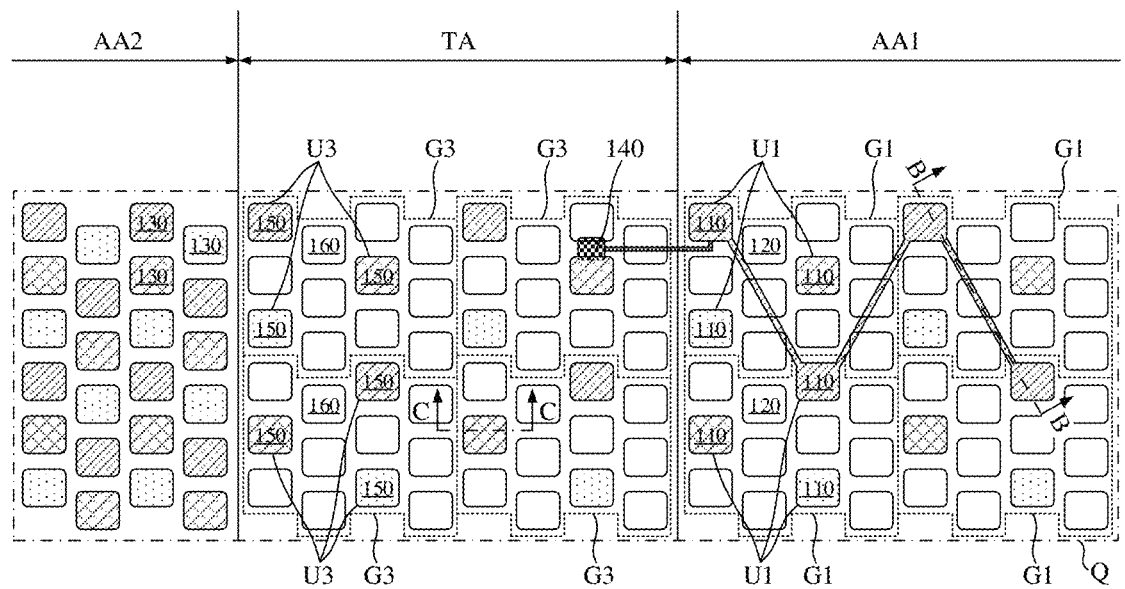
FIG. 5 is a partial enlarged view of the region Q in FIG. 1 of still another example.
Figure 6:
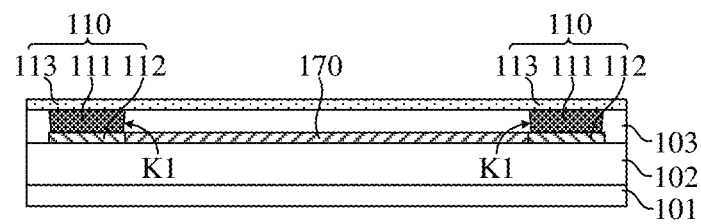
FIG. 6 is a cross-section view in the B-B direction in FIG. 5 of an example.
Figure 7:
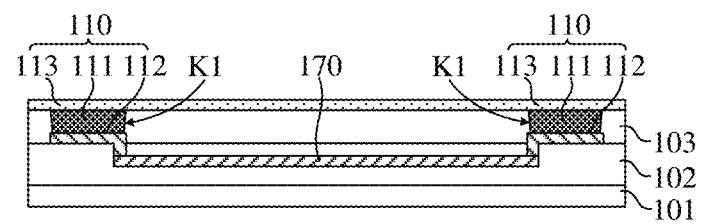
FIG. 7 is a cross-section view in the B-B direction in FIG. 5 of another example.
Figure 8:
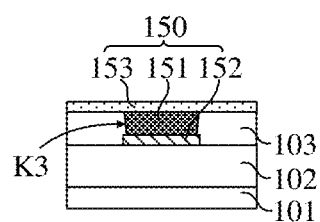
FIG. 8 is a cross-section view in the C-C direction in FIG. 5 of an example.

FIG. 5 is a partial enlarged view of the region Q in FIG. 1 of still another example, FIG. 6 is a cross-section view in the B-B direction in FIG. 5 of an example, and FIG. 7 is a cross-section view in the B-B direction in FIG. 5 of another example. FIG. 8 is a cross-section view of an example in the C-C direction in FIG. 5. A portion of the structures of the embodiment in FIGS. 5, 6, 7 and 8 are identical with that of the embodiment in FIG. 4, and will not be described in detail herein. The difference between them will be described below.

As shown in FIGS. 5, 6, 7 and 8, in some embodiments, the display panel 100 comprises a substrate 101, a component layer 102, and a pixel definition layer 103. The component layer 102 is located on the substrate 101 and the first pixel circuit 140 is located in the component layer 102. The pixel definition layer 103 is located on the component layer 102.

The substrate 101 may be made of a transparent material such as glass or polyimide (PI). The component layer 102 may comprise the pixel circuits for driving various sub-pixels to display. The pixel definition layer 103 comprises a first pixel opening K1 located in the first display area AA1 and a third pixel opening K3 located in the transition display area TA. In some embodiments, the pixel definition layer 103 comprises a second pixel opening located in the second display area AA2.

In some embodiments, a light-emitting sub-pixel 110 comprises a first light-emitting structure 111, a first electrode 112, and a second electrode 113. The first light-emitting structure 111 is located within the first pixel opening K1, the first electrode 112 is located on a side of the first light-emitting structure 111 facing towards the substrate 101, and the second electrode 113 is located on a side of the light-emitting structure 111 facing away from the substrate 101. One of the first electrode 112 and the second electrode 113 is an anode, and the other is a cathode.

In some embodiments, a second sub-pixel 130 comprises a second light-emitting structure, a third electrode and a fourth electrode. The second light-emitting structure is located within the second pixel opening, the third electrode 112 is located on a side of the second light-emitting structure facing towards the substrate 101, and the fourth electrode 113 is located on a side of the light-emitting structure facing away from the substrate 101. One of the third electrode and the fourth electrode is an anode, and the other is a cathode.

In some embodiments, a third light-emitting sub-pixel 150 comprises a third light-emitting structure 151, a fifth electrode 152 and a sixth electrode 153. The third light-emitting structure 151 is located within the third pixel opening K3, the fifth electrode 152 is located on a side of the third light-emitting structure 151 facing towards the substrate 101, and the sixth electrode 153 is located on a side of the light-emitting structure 151 facing away from the substrate 101. One of the fifth electrode 152 and the sixth electrode 153 is an anode, and the other is a cathode.

In the embodiment, it is described taking the first electrode 112, the third electrode, the fifth electrode 152 as the anodes and the second electrode 113, the fourth electrode, the sixth electrode 153 as the cathodes as an example.

Each of the first light-emitting structure 111, the second light-emitting structure, the third light-emitting structure 151 may comprise an OLED light-emitting layer, and may further comprise at least one of a hole injection layer, a hole transport layer, an electron injection layer or an electron transport layer according to design requirements of the light-emitting structure 111, the second light-emitting structure, the third light-emitting structure 151.

In some embodiments, the first electrodes 112 are transparent electrodes. In some embodiments, the first electrode 112 comprises an indium tin oxide (ITO) layer or an indium zinc oxide layer. In some embodiments, the first electrode 112 is a opaque electrode, that is, the first electrode 112 is a reflective electrode including a first transparent conductive layer, a reflective layer on the first transparent conductive layer, and a second transparent conductive layer on the reflective layer. The first and second transparent conductive layers may be made of ITO, indium zinc oxide or the like, and the reflective layer may a metal layer, for example, made of silver. The third electrode, the fifth electrode 152 can be made of the same material as the first electrode 112 respectively.

In some embodiments, the second electrode 113 comprises a magnesium-silver alloy layer. The fourth electrode, the sixth electrode 153 can be made of the same material as the second electrode 113 respectively. In some embodiments, the second electrode 113, the fourth electrode, the sixth electrode 153 may be interconnected as a common electrode.

In some embodiments, the orthographic projection of each first light-emitting structure 111 on the substrate 101 is composed of one first graphic unit or composed of two or more first graphic units spliced together. The first graphic unit comprises at least one selected from the group consisting of a circle, an oval, a dumbbell, a calabash, and a rectangle.

In some embodiments, the orthographic projection of each first electrode 112 on the substrate 101 is composed of one second graphic unit or composed of two or more second graphic units spliced together. The second graphic unit comprises at least one selected from the group consisting of a circle, an oval, a dumbbell, a calabash, and a rectangle.

In some embodiments, the orthographic projection of each third light-emitting structure 151 on the substrate 101 is composed of one third graphic unit or composed of two or more third graphic units spliced together. The third graphic unit comprises at least one selected from the group consisting of a circle, an oval, a dumbbell, a calabash, and a rectangle.

In some embodiments, the orthographic projection of each fifth electrode 152 on the substrate 101 is composed of one fourth graphic unit or composed of two or more fourth graphic units spliced together. The fourth graphic unit comprises at least one selected from the group consisting of a circle, an oval, a dumbbell, a calabash, and a rectangle.

As shown in FIG. 5, in some embodiments, the first electrodes 112 of each first predetermined number of the first light-emitting sub-pixels 110 are electrically interconnected via a first interconnection structure 170, such that the first light-emitting sub-pixels 110 with the interconnected first electrodes 112 form a pixel combination structure and may be electrically connected to the same first pixel circuit 140. Thus, one first pixel circuit 140 drives the first predetermined number of the first light-emitting sub-pixels 110 to display, thereby further reducing the actual PPI of the first display area AA1, reducing the drive wiring in the first display area AA1, and improving the light transmittance thereof.

In some embodiments, the aforesaid first predetermined number is from two to eight, for example, four, that is, the first electrodes 112 of every four first light-emitting sub-pixels 110 are electrically connected to each other via the first interconnection structure 170. As shown in FIG. 6, in some embodiments, the first interconnection structure 170 is arranged in the same layer as the first electrodes 112. As shown in FIG. 7, in some embodiments, the first interconnection structure 170 may also be located within the component layer 102 and electrically connected to the first electrodes 112 through the first via holes. The first interconnection structure 170 may be made of the same material as the first electrodes 112 or of other conductive materials. Preferably, the first interconnection structure 170 is a transparent conductive structure, for example, made of ITO.

Further, in this embodiment, in the first pixel arrangement architecture, at least any two of the first light-emitting sub-pixels 110 in each first light-emitting pixel unit U1 are spaced apart by a first non-light-emitting sub-pixel 120, such that the first light-emitting sub-pixels 110 of various colors in the first display area AA1 can be distributed more uniformly, thereby improving the color uniformity of display.

Further, the first light-emitting sub-pixels 110 and the first non-light-emitting sub-pixels 120 are arranged in an array to form a plurality of rows and/or columns. The first light-emitting sub-pixels 110 of an identical color of at least a portion of the adjacent first pixel groups G1 are located in different rows or columns, such that the first light-emitting sub-pixels 110 of various colors in the first display area AA1 are distributed further uniformly, thereby further improving the color uniformity of display. Moreover, the aforesaid structure increases the interval between the first light-emitting sub-pixels 110 of an identical color, and provides more sufficient wiring space for sub-pixel combination of the first light-emitting sub-pixels 110 of an identical color, facilitating the arrangement of the first interconnection structure 170.

In other embodiments, the fifth electrodes 152 of each second predetermined number of third light-emitting sub-pixels 150 are electrically connected to each other via a second interconnection structure. Wherein the second predetermined number is from two to eight, for example, four. In some embodiments, the second interconnection structure is arranged in the same layer as the fifth electrodes 152. In some embodiments, the second interconnection structure is located within the component layer 102 and electrically connected to the fifth electrodes 152 through the second via holes. The second interconnection structure may be made of the same material as the fifth electrodes 152 or of other conductive materials. Preferably, the second interconnection structure is a transparent conductive structure.

When the fifth electrodes 152 of each second number of third light-emitting sub-pixels 150 are electrically connected to each other via the second interconnection structure, in some embodiments, in the third pixel arrangement architecture, at least any two of the third light-emitting sub-pixels 150 in each third light-emitting pixel unit U3 are spaced apart by a third non-light-emitting sub-pixel 160. In some embodiments, the third light-emitting sub-pixels 150 and the third non-light-emitting sub-pixels 160 are arranged in an array to form a plurality of rows and/or columns. The third light-emitting sub-pixels 150 of an identical color of at least a portion of the adjacent third pixel groups G3 are located in different rows or columns, such that the third light-emitting sub-pixels 150 of various colors in the transition display area TA are distributed further uniformly, thereby further improving the color uniformity of display, and the interval between the third light-emitting sub-pixels 150 of an identical color is improved to provide more sufficient wiring space for sub-pixel combining of the third light-emitting sub-pixels 150 of an identical color.

For example, the display panel 100 may further comprise an encapsulation layer as well as a polarizer and a cover plate located over the encapsulation layer, or a cover plate may be arranged directly over the encapsulation layer without a polarizer, or at least a cover plate is arranged directly over the encapsulation layer of the first display area AA1 without a polarizer, so as to prevent the polarizer from affecting the light collection number of the photosensitive component arranged correspondingly underneath the first display area AA1. Off course, there may be also be provided with a polarizer above the encapsulation layer of the first display area AA1.

Embodiments of the application also provide a display device, which may comprise the display panel 100 of any of the embodiments described above. Hereinafter, a display device of an embodiment, in which the display device comprises the display panel 100 of the above-described embodiments, will be described as an example.

Figure 9:
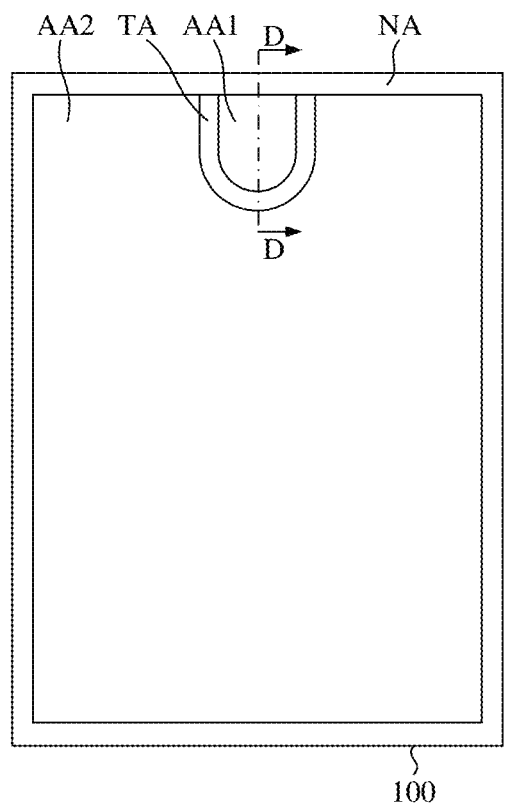
FIG. 9 is a schematic top view of a display device provided according to an embodiment of the application.
Figure 10:
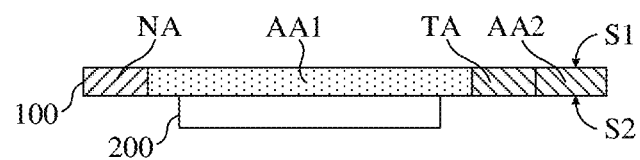
FIG. 10 is a cross-section view in the D-D direction in FIG. 9 of an example.

FIG. 9 is a schematic top view of a display device provided according to an embodiment of the application, and FIG. 10 is a cross-section view in the D-D direction in FIG. 9 of an example. In the display device of the embodiment, the display panel 100 may be the display panel 100 according to one of the embodiments described above. The display panel 100 comprises a first display area AA1 and a second display area AA2, and the first display area AA1 has a light transmittance greater than that of the second display area AA2.

The display panel 100 comprises a first surface S1 and a second surface S2, in which the first surface S1 is a display surface. The display device further comprises a photosensitive component 200, which is located on the side of the second surface S2 of the display panel 100 and corresponds to the first display area AA1 in location.

The photosensitive component 200 may be an image capture device for capturing external image information. In the embodiment, the photosensitive component 200 is a complementary metal oxide semiconductor (CMOS) image capture device, and in some other embodiments, the photosensitive component 200 may also be a charge-coupled device (CCD) image capture device and image capture devices of other forms. The photosensitive component 200 may not be limited to an image capture device. For example, in some embodiments, the photosensitive component 200 may also be a light sensor such as an infrared sensor, a proximity sensor, an infrared lens, a flood light sensing element, an ambient light sensor, or a dot matrix projector. In addition, the display device may be integrated with other components, such as an earpiece and a speaker, on the second surface S2 of the display panel 100.

In the display device according to the embodiment of the application, the first display area AA1 has a light transmittance greater than that of the second display area AA2, such that the display panel 100 can be integrated with a photosensitive component 200 on the side of the first display area AA1 opposite to the display side to achieve under-screen integration of a photosensitive component such as an image capture device while the first display area AA1 can display a picture, thereby improving the display area of the display panel 100 and realizing the full-screen design of the display device.

The display panel 100 comprises a plurality of first pixel groups G1 in the first display area AA1. Each of the first pixel groups G1 comprises a first light-emitting pixel unit U1 and a plurality of first non-light-emitting sub-pixels 120, wherein the first light-emitting pixel unit U1 comprises a plurality of first light-emitting sub-pixels 110. Since the first pixel group G1 has both the first light-emitting sub-pixels 110 capable of light-emitting displaying and the first non-light-emitting sub-pixels 120 without light-emitting displaying, the actual PPI of the first display area AA1 can be lowered, wherein only the first light-emitting sub-pixels 110 are connected to the drive signal lines, such that the number of the drive signal lines arranged in the first display area AA1 is reduced, so as to improve the light transmittance of the first display area AA1.

A first pixel arrangement architecture formed together by the first light-emitting sub-pixels 110 and the first non-light-emitting sub-pixels 120 is identical to a second pixel arrangement architecture formed by the second sub-pixels 130 in the second display area AA2. When the first display area AA1 is adjacent to the second display area AA2, the display panel 100 can improve the light transmittance of the first display area AA1 while blurring the boundary between the second display area AA2 of higher PPI and the first display area AA1 of lower PPI in the displayed picture of the display panel 100, thereby avoiding the obvious boundary between the two display areas, and improving the display effect.

In some embodiments, the display panel 100 further comprises a transition display area TA between the first display area AA1 and the second display area AA2, and the first pixel circuit 140 for driving the first light-emitting sub-pixel 110 to display is located in the transition display area TA, thereby reducing the wiring structure in the first display area AA1 and increasing the light transmittance of the first display area AA1.

The display panel 100 further comprises a plurality of third pixel groups G3 located in the transition display area TA. The third pixel arrangement architecture formed together by the third light-emitting sub-pixels 150 and the third non-light-emitting sub-pixels 160 comprised in the third pixel group G3 is identical to the second pixel arrangement architecture, such that the boundary between the second display area AA2 of higher PPI and the transition display area TA of lower PPI in the displayed picture of the display panel 100 is blurred, thereby avoiding a clear boundary between the two display areas and improving the display effect.

In accordance with the embodiments of the application as described above, these embodiments are not intended to be exhaustively set forth all the details, nor are they intended to limit the application to the specific embodiments described. It will be apparent that many modifications and variations are possible from the above description. These embodiments have been chosen and described in detail in the description in order to better explain the principle and practical application of the application, thereby enabling a person skilled in the art to make better use of the application and its modifications. The application is limited only by the claims and their full scope and equivalents.

What is claimed is:

1. A display panel comprising:
   a first display area;
   a second display area, the first display area having a light transmittance greater than that of the second display area;
   a plurality of first pixel groups located in the first display area, each of the plurality of first pixel groups comprising a first light-emitting pixel unit and a plurality of first non-light-emitting sub-pixels, the first light-emitting pixel unit comprising a plurality of first light-emitting sub-pixels; and
   a plurality of second sub-pixels located in the second display area,
   wherein a first pixel arrangement architecture formed together by the plurality of first light-emitting sub-pixels and the plurality of first non-light-emitting sub-pixels is identical to a second pixel arrangement architecture formed by the plurality of second sub-pixels and in each of the plurality of first pixel groups, the number of the plurality of first non-light-emitting sub-pixels is a positive integer multiple of the number of the plurality of first light-emitting sub-pixels.

2. The display panel according to claim 1, wherein the display panel further comprises:

a transition display area located between the first display area and the second display area;

a first pixel circuit located in the transition display area, the first pixel circuit being electrically connected to the first light-emitting sub-pixel for driving the first light-emitting sub-pixel to display;

a plurality of third pixel groups located in the transition display area, each of the plurality of third pixel groups comprising a third light-emitting pixel unit and a plurality of third non-light-emitting sub-pixels, the third light-emitting pixel unit comprising a plurality of third light-emitting sub-pixels, a third pixel arrangement architecture formed together by the plurality of third light-emitting sub-pixels and the plurality of third non-light-emitting sub-pixels being identical to the second pixel arrangement architecture.

3. The display panel according to claim 2, wherein the plurality of second sub-pixels and the plurality of third light-emitting sub-pixels comprise multiple types of sub-pixels of different colors respectively, the size of the plurality of third light-emitting sub-pixels being the same as that of the plurality of second sub-pixels of an identical color.

4. The display panel according to claim 1, wherein the plurality of first light-emitting sub-pixels and the plurality of second sub-pixels comprise multiple types of sub-pixels of different colors respectively, the size of the plurality of first light-emitting sub-pixels being smaller than that of the plurality of second sub-pixels of an identical color.

5. A display panel according to claim 2, wherein, in the first pixel arrangement architecture, the plurality of first light-emitting sub-pixels in each of the first light-emitting pixel units are arranged to be adjacent to each other; and/or in the third pixel arrangement architecture, the plurality of third light-emitting sub-pixels in each of the third light-emitting pixel units are arranged to be adjacent to each other.

6. The display panel according to claim 5, wherein the plurality of first non-light-emitting sub-pixels in each of the plurality of first pixel groups are arranged to form at least one first non-light-emitting pixel unit, an arrangement pattern of the plurality of first non-light-emitting sub-pixels in the at least one first non-light-emitting pixel unit being matched with that of the plurality of first light-emitting sub-pixels in the first light-emitting pixel unit, the first light-emitting pixel unit and the at least one first non-light-emitting pixel unit being arranged in an array, wherein the first light-emitting pixel units of at least a portion of the adjacent first pixel groups are located in different rows or columns; and/or the plurality of third non-light-emitting sub-pixels in each of the plurality of third pixel groups are arranged to form at least one third non-light-emitting pixel unit, the arrangement pattern of the plurality of third non-light-emitting sub-pixels in the at least one third non-light-emitting pixel unit being matched with that of the plurality of third light-emitting sub-pixels in the third light-emitting pixel unit, the third light-emitting pixel unit and the at least one third non-light-emitting pixel unit being arranged in an array, wherein the third light-emitting pixel units of at least a portion of the adjacent third pixel groups are located in different rows or columns.

7. The display panel according to claim 2, wherein, in the first pixel arrangement architecture, at least any two of the plurality of first light-emitting sub-pixels in each of the first light-emitting pixel units are spaced apart by the first non-light-emitting sub-pixel; and/or in the third pixel arrangement architecture, at least any two of the plurality of third light-emitting sub-pixels in each of the third light-emitting pixel units are spaced apart by the third non-light-emitting sub-pixel.

8. The display panel according to claim 2, wherein the plurality of first light-emitting sub-pixels and the plurality of third sub-pixels comprise multiple types of sub-pixels of different colors respectively, the plurality of first light-emitting sub-pixels and the plurality of first non-light-emitting sub-pixels being arranged in an array, the plurality of first light-emitting sub-pixels of an identical color of at least a portion of the adjacent first pixel groups being located in different rows or columns; and/or the plurality of third light-emitting sub-pixels and the plurality of third non-light-emitting sub-pixels are arranged in an array, the plurality of third light-emitting sub-pixels of an identical color of at least a portion of the adjacent third pixel groups being located in different rows or columns.

9. The display panel according to claim 2, wherein the display panel comprises:

a substrate;

a component layer located on the substrate, the first pixel circuit being located in the component layer; and a pixel definition layer located on the component layer, the pixel definition layer comprising a first pixel opening located in the first display area and a third pixel opening located in the transition display area, the first light-emitting sub-pixel comprising a first light-emitting structure, a first electrode, and a second electrode, the first light-emitting structure being located within the first pixel opening, the first electrode being located on a side of the first light-emitting structure facing toward the substrate, the second electrode being located on a side of the first light-emitting structure facing away from the substrate;

the third light-emitting sub-pixel comprising a third light-emitting structure, a fifth electrode, and a sixth electrode, the third light-emitting structure being located within the third pixel opening, the fifth electrode being located on a side of the third light-emitting structure facing toward the substrate, the sixth electrode being located on a side of the third light-emitting structure facing away from the substrate.

10. The display panel according to claim 9, wherein the first electrodes of each first predetermined number of the plurality of first light-emitting sub-pixels are electrically connected to each other via a first interconnection structure; and/or the fifth electrodes of each second predetermined number of the plurality of third light-emitting sub-pixels are electrically connected to each other via a second interconnection structure.

11. The display panel according to claim 10, wherein the first predetermined number is from two to eight; and/or the second predetermined number is from two to eight.

12. The display panel according to claim 10, wherein the first interconnection structure is arranged in the same layer as the first electrodes; and/or the second interconnection structure is arranged in the same layer as the fifth electrodes.

13. The display panel according to claim 10, wherein the first interconnection structure is located within the component layer and is electrically connected to the first electrodes through a first via hole; and/or the second interconnection structure is located within the component layer and is electrically connected to the fifth electrodes through a second via hole.

14. The display panel according to claim 10, wherein the first interconnection structure is a transparent conductive structure; and/or the second interconnection structure is a transparent conductive structure.

15. The display panel according to claim 1, wherein, in each of the plurality of first pixel groups, the number of the plurality of first non-light-emitting sub-pixels is 3 times that of the plurality of first light-emitting sub-pixels.

16. The display panel according to claim 2, wherein, in each of the plurality of third pixel groups, the number of the plurality of third non-light-emitting sub-pixels is a positive integer multiple of the number of the plurality of third light-emitting sub-pixels.

17. The display panel according to claim 2, wherein, in each of the plurality of third pixel groups, the number of the plurality of third non-light-emitting sub-pixels is 3 times that of the plurality of third light-emitting sub-pixels.

18. The display panel according to claim 2, wherein a ratio of the number of the plurality of first non-light-emitting sub-pixels to the number of the plurality of first light-emitting sub-pixels in each of the plurality of first pixel groups, is equal to a ratio of the number of the plurality of third non-light-emitting sub-pixels to the number of the plurality of third light-emitting sub-pixels in each of the plurality of third pixel groups.

19. A display panel comprising:
a first display area;
a second display area, the first display area having a light transmittance greater than that of the second display area;
a transition display area located between the first display area and the second display area;
a first pixel circuit located in the transition display area, the first pixel circuit being electrically connected to the first light-emitting sub-pixel for driving the first light-emitting sub-pixel to display;
a plurality of first pixel groups located in the first display area, each of the plurality of first pixel groups comprising a first light-emitting pixel unit and a plurality of first non-light-emitting sub-pixels, the first light-emitting pixel unit comprising a plurality of first light-emitting sub-pixels; and
a plurality of second sub-pixels located in the second display area,
wherein a first pixel arrangement architecture formed together by the plurality of first light-emitting sub-pixels and the plurality of first non-light-emitting sub-pixels is identical to a second pixel arrangement architecture formed by the plurality of second sub-pixels, and a plurality of third pixel groups located in the transition display area, each of the plurality of third pixel groups comprising a third light-emitting pixel unit and a plurality of third non-light-emitting sub-pixels, the third light-emitting pixel unit comprising a plurality of third light-emitting sub-pixels, a third pixel arrangement architecture formed together by the plurality of third light-emitting sub-pixels and the plurality of third non-light-emitting sub-pixels being identical to the second pixel arrangement architecture.

20. A display panel comprising:
a first display area;
a second display area, the first display area having a light transmittance greater than that of the second display area;
a plurality of first pixel groups located in the first display area, each of the plurality of first pixel groups comprising a first light-emitting pixel unit and a plurality of first non-light-emitting sub-pixels, the first light-emitting pixel unit comprising a plurality of first light-emitting sub-pixels; and
a plurality of second sub-pixels located in the second display area,
wherein a first pixel arrangement architecture formed together by the plurality of first light-emitting sub-pixels and the plurality of first non-light-emitting sub-pixels is identical to a second pixel arrangement architecture formed by the plurality of second sub-pixels, and the plurality of first light-emitting sub-pixels and the plurality of second sub-pixels comprise multiple types of sub-pixels of different colors respectively, the size of the plurality of first light-emitting sub-pixels being smaller than that of the plurality of second sub-pixels of an identical color.

* * * * *